United States Patent
Ai et al.

(10) Patent No.: US 11,967,602 B2
(45) Date of Patent: Apr. 23, 2024

(54) IMAGE SENSOR WITH MULTI-PIXEL DETECTOR AND PARTIAL ISOLATION STRUCTURE

(71) Applicant: OmniVision Technologies, Inc., Santa Clara, CA (US)

(72) Inventors: Chun-Yung Ai, Campbell, CA (US); Kazufumi Watanabe, Mountain View, CA (US); Chih-Wei Hsiung, San Jose, CA (US); Vincent Venezia, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 285 days.

(21) Appl. No.: 16/901,894

(22) Filed: Jun. 15, 2020

(65) Prior Publication Data
US 2021/0391363 A1     Dec. 16, 2021

(51) Int. Cl.
*H01L 27/15*     (2006.01)
*G03B 13/36*     (2021.01)
*H01L 27/146*    (2006.01)

(52) U.S. Cl.
CPC ......... *H01L 27/1463* (2013.01); *G03B 13/36* (2013.01); *H01L 27/14605* (2013.01); *H01L 27/14627* (2013.01); *H01L 27/14645* (2013.01)

(58) Field of Classification Search
None
See application file for complete search history.

(56) References Cited

U.S. PATENT DOCUMENTS

| | | | |
|---|---|---|---|
| 9,485,442 B1 | 11/2016 | Li et al. | |
| 9,807,294 B2 | 10/2017 | Liu et al. | |
| 9,838,590 B2 | 12/2017 | Zhang et al. | |
| 9,893,111 B2 | 2/2018 | Chou et al. | |
| 10,002,899 B2 | 6/2018 | Chou et al. | |
| 10,015,389 B2 | 7/2018 | Lu et al. | |
| 10,154,234 B2 | 12/2018 | Liu et al. | |
| 11,367,744 B2 * | 6/2022 | Pang | H04N 25/704 |
| 11,412,165 B2 * | 8/2022 | Kim | H01L 27/14621 |
| 2010/0109060 A1 | 5/2010 | Mao et al. | |
| 2011/0079866 A1 * | 4/2011 | Nishizawa | H01L 27/14641 257/E27.122 |
| 2012/0009720 A1 * | 1/2012 | Shim | H01L 27/14625 257/E31.127 |
| 2019/0096945 A1 | 3/2019 | Lu et al. | |
| 2019/0198564 A1 * | 6/2019 | Tandon | H01L 27/156 |
| 2019/0394389 A1 | 12/2019 | Lu et al. | |
| 2020/0045223 A1 | 2/2020 | Pang et al. | |
| 2020/0280659 A1 * | 9/2020 | Galor Gluskin | H01L 27/14623 |

\* cited by examiner

*Primary Examiner* — Ali Naraghi
(74) *Attorney, Agent, or Firm* — Christensen O'Connor Johnson Kindness PLLC

(57) ABSTRACT

A multi-pixel detector of an image sensor is described. The multi-pixel detector includes a first photodiode region disposed within a semiconductor substrate to form a first pixel, a second photodiode region disposed within the semiconductor substrate to form a second pixel adjacent to the first pixel, and a partial isolation structure extending from a first side of the semiconductor substrate towards a second side of the semiconductor substrate between the first photodiode region and the second photodiode region. A length of a lateral portion of the partial isolation structure between the first photodiode region and the second photodiode region is less than a lateral length of the first photodiode region.

20 Claims, 7 Drawing Sheets

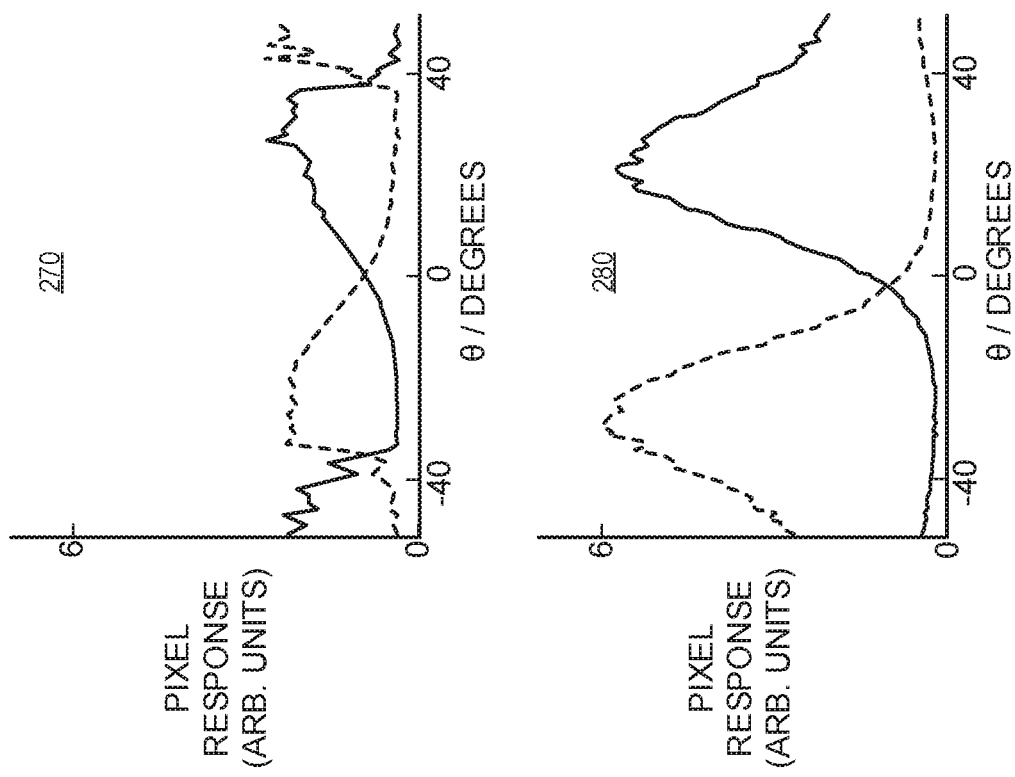
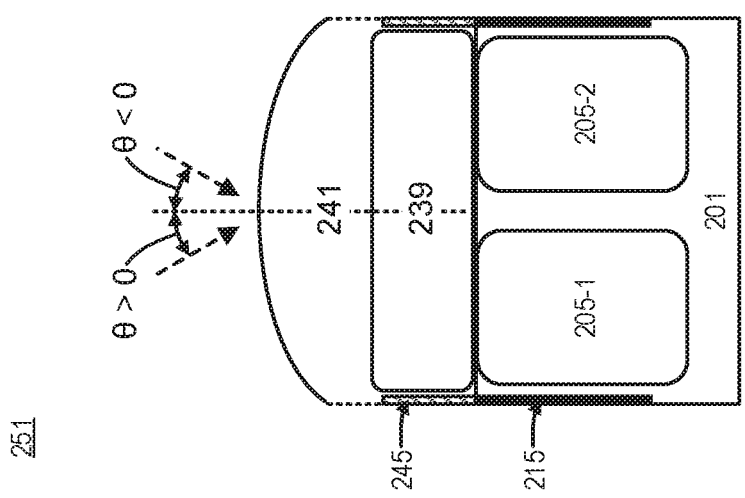
FIG. 2B
FIG. 2A

IMAGE SENSOR WITH MULTI-PIXEL DETECTOR AND PARTIAL ISOLATION STRUCTURE

TECHNICAL FIELD

This disclosure relates generally to image sensors, and in particular but not exclusively, relates CMOS image sensors and applications thereof.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIG. 2A illustrates a partial cross sectional view of an image sensor with a multi-pixel detector without a partial isolation structure, in accordance with the teachings of the present disclosure.

FIG. 2B illustrates angular selectivity with respect to exposure time of a multi-pixel detector without a partial isolation structure, in accordance with the teachings of the present disclosure.

DETAILED DESCRIPTION

Figure 1A:
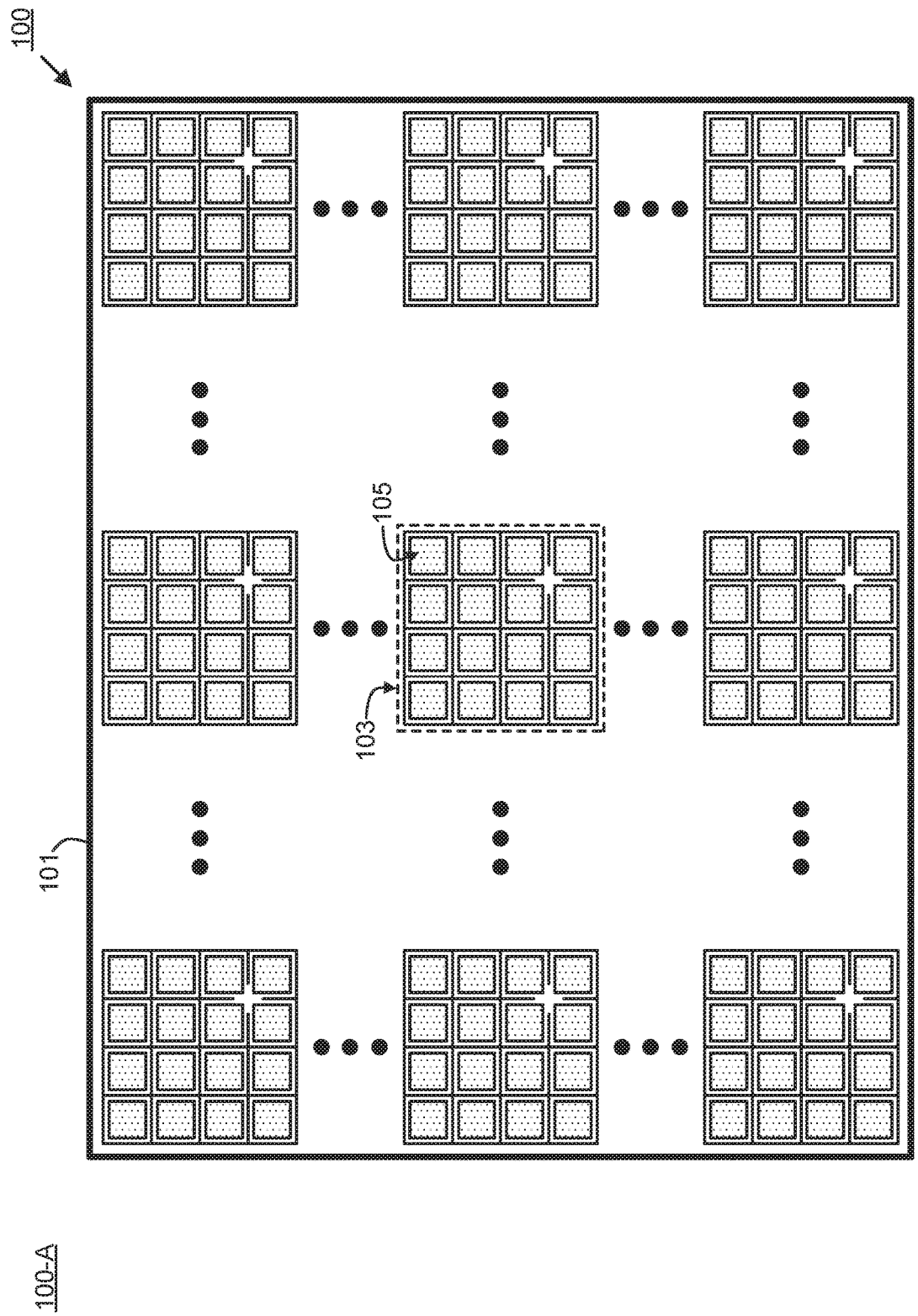
FIG. 1A illustrates a top view of an image sensor with a multi-pixel detector and partial isolation structure, in accordance with the teachings of the present disclosure.

Embodiments of an apparatus and system each including or otherwise related to an image sensor with a multi-pixel detector and a partial isolation structure. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Embodiments described herein utilize an image sensor with an architecture that may include a plurality of repeat units, each of the repeat units structured to include a multi-pixel detector to gather phase information of incident light representative of an external scene (e.g., for phase detection autofocus). In some embodiments, the multi-pixel detector may include a plurality of photodiode regions arranged in rows and columns to form a two-by-two array of pixels. Advantageously, the multi-pixel detector includes one or more partial isolation structures disposed between photodiode regions of the two-by-two array of pixels that provides improved light sensitivity and angular selectivity. Collectively, the partial isolation structures of a given two-by-two array of pixels may be referred to as a multi-finger isolation structure. In some embodiments, a lateral length of fingers (i.e., individual partial isolation structures) of a given multi-finger isolation structure may be adjusted to homogenize angular selectivity of the multi-pixel detectors throughout the image sensor, which may be utilized to improve phase detection autofocus under varying lighting conditions. In the same or other embodiments, each of the two-by-two array of pixels may be respectively aligned with a shared microlens having a variable degree of offset dependent on position within the image sensor to further tune (i.e., homogenize) the angular selectivity and light sensitivity of the multi-pixel detectors included in the image sensor.

Figure 1B:
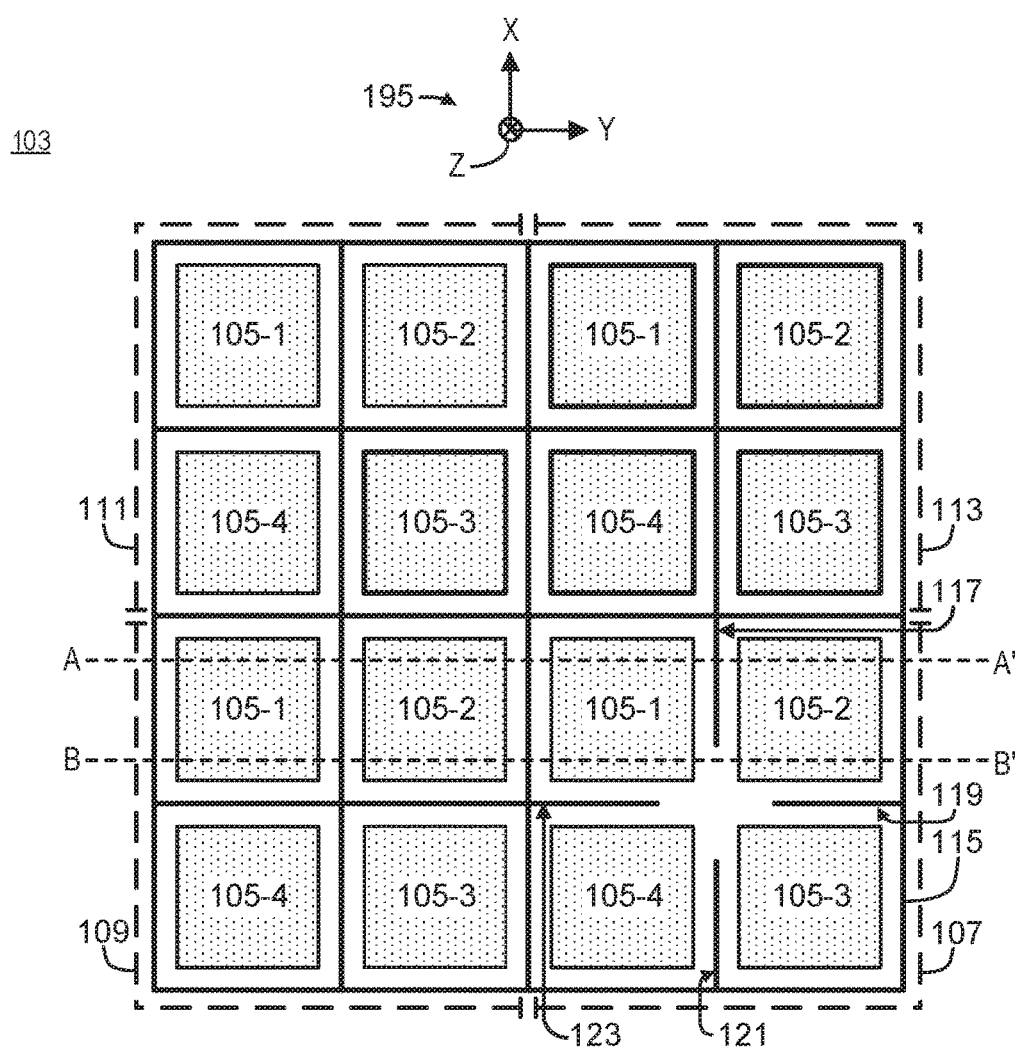
FIG. 1B illustrates a top view of a repeat unit included in an image sensor with a multi-pixel detector and a partial isolation structure, in accordance with the teachings of the present disclosure.
Figure 1C:
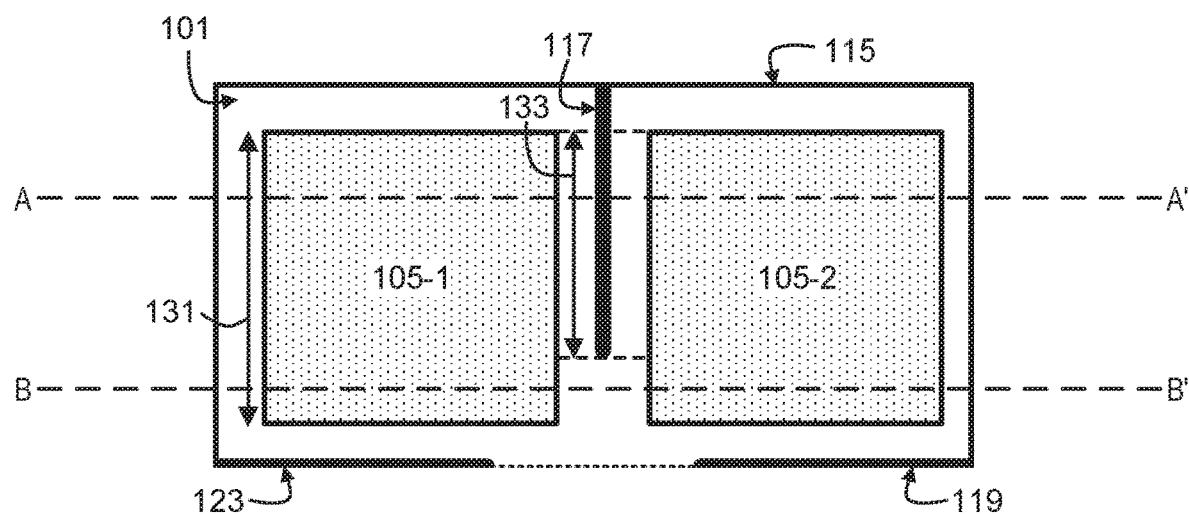
FIG. 1C illustrates a magnified top view of a partial isolation structure included in a multi-pixel detector, in accordance with the teachings of the present disclosure.
Figure 1D:
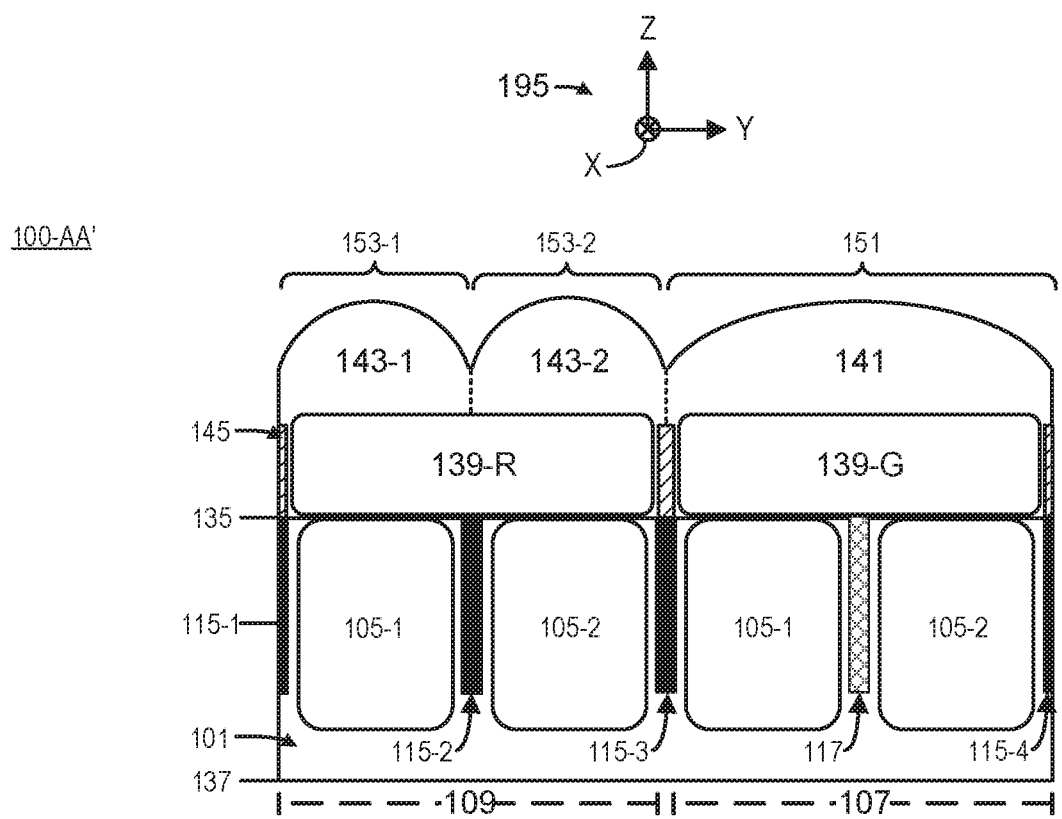
FIGS. 1D-1E illustrate partial cross sectional views of an image sensor with a multi-pixel detector and a partial isolation structure, in accordance with the teachings of the present disclosure.
Figure 1E:
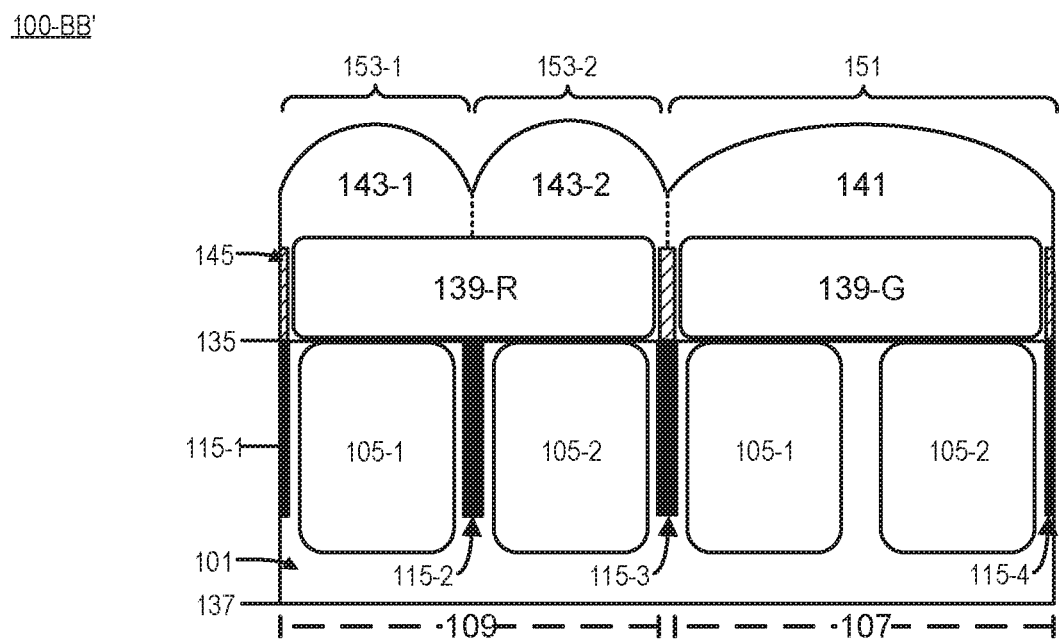

FIGS. 1A-1E illustrate representative views of an image sensor 100 including a multi-pixel detector and partial isolation structure. It is appreciated that the views presented in FIGS. 1A-1E may omit certain elements of image sensor 100 to avoid obscuring details of the disclosure. In other words, not all elements of image sensor 100 may be labeled, illustrated, or otherwise shown within an individual one of FIGS. 1A-1E. It is further appreciated that in some embodiments, image sensor 100 may not necessarily include all elements shown in FIGS. 1A-1E. Additionally, it is noted that various views or partial views of the image sensor 100 in FIGS. 1A-1E are illustrated with respect to a coordinate system 195 formed by axes x, y, and z, where the x-y plane is parallel to a planarized first side 150 of the semiconductor substrate 101 (e.g., as shown in FIGS. 1D-1E).

FIG. 1A illustrates a top view 100-A of image sensor 100 with a multi-pixel detector and partial isolation structure, in accordance with the teachings of the present disclosure. Image sensor 100 includes a plurality of repeat units 103 disposed within semiconductor substrate 101 (e.g., a silicon wafer). Each repeat unit includes pixels arranged in an array (e.g., of four rows and four columns) formed, at least in part, from photodiode regions 105 disposed within the semiconductor substrate 101. The photodiode regions 105 are regions of the semiconductor substrate 101 that have been doped or otherwise modified to facilitate the generation of image charge (e.g., accumulated charge generated proportionally in response to a magnitude or intensity of incident light) for light sensing. More specifically, the image charge may be extracted or otherwise measured (e.g., by readout circuitry) for gathering phase difference information, generating an image representative of an external scene, and the like.

The repeat units 103 of image sensor 100 are positioned within the semiconductor substrate 101 in a regular, repeating manner (e.g., as an array of repeat units) to collectively form image sensor 100. It is appreciated that each repeat unit of the image sensor 100 may include a multi-pixel detector for gathering phase information and a plurality of image pixels (see, e.g., FIG. 1B) for image generation. However, in other embodiments, other repeat units (e.g., repeat units without a multi-pixel detector) may also be included in the image sensor 100. In other words, the number of multi-pixel detectors within the image sensor 100 may be tailored to a target specification. Thus, it is appreciated that in some embodiments, the illustrated repeat unit 103 may be a minimal repeat unit of image sensor 100. However, the illustrated embodiment of image sensor 100 should not be deemed limiting and that other configurations or architectures may be utilized, in accordance with the teachings of the present disclosure. Additionally, it is appreciated that certain elements may be omitted to avoid obscuring certain aspects of the disclosure. For example, the illustrated embodiment of image sensor 100 included in FIG. 1A may further include one or more microlenses, color filters, metal grids, circuitry, and the like, which have been omitted for clarity.

FIG. 1B illustrates a top view of repeat unit 103 included in image sensor 100 of FIG. 1A, in accordance with the teachings of the present disclosure. The illustrated view of repeat unit 103 in FIG. 1B may be representative of each repeat unit included in image sensor 100 along the x-y plane of coordinate system 195. Repeat unit 103 includes a first quadrant 107, a second quadrant 109, a third quadrant 111, and a fourth quadrant 113, each including a plurality of photodiode regions 105 arranged in rows and columns to form a two-by-two array of pixels (e.g., 105-1, 105-2, 105-3, and 105-4). It is appreciated that each pixel may be referred in relation to a given photodiode region 105. For example, a first pixel included in the first quadrant 107 may be referred to in relation to photodiode region 105-1. A given pixel may be defined as an element of image sensor 100 capable of generating image charge in response to incident light; the image charge capable of being measured or otherwise quantified, for example, in the form of a voltage and/or current measurement that is proportional to an intensity or power of the light incident upon the given pixel.

In the illustrated embodiment, the first quadrant 107 forms a multi-pixel detector included in the image sensor that is capable of gathering phase information of the incident light (e.g., a sensor for phase detection autofocus). The first quadrant 107 includes a first photodiode region 105-1, a second photodiode region 105-2, a third photodiode region 105-3, and a fourth photodiode region 105-4, each forming a respective first pixel, second pixel, third pixel, and fourth pixel that collectively form the multi-pixel detector. Based on the arrangement of the photodiode regions 105, the first pixel (i.e., photodiode region 105-1) is laterally adjacent to the second pixel (i.e., photodiode region 105-2) and the fourth pixel (i.e., photodiode region 105-4), the second pixel is laterally adjacent to the first pixel and the third pixel (i.e., photodiode region 105-3), the third pixel is laterally adjacent to the fourth pixel and the second pixel, and the fourth pixel is laterally adjacent to the third pixel and the first pixel. It is appreciated that the term "lateral" or "laterally" is in reference to a direction substantially parallel to the x-y plane of coordinate system 195. Additionally, it is noted that the first pixel and third pixels are diagonally adjacent from one another. Similarly, the second and fourth pixels are diagonally adjacent from one another.

As illustrated in FIG. 1B, the photodiode regions 105 of the first quadrant 107 are laterally surrounded, collectively, by a deep trench isolation structure 115. It is appreciated that the deep trench isolation structure 115 forms a perimeter boundary defining the first quadrant 107. The multi-pixel detector further includes a multi-finger isolation structure that includes four fingers (e.g., partial isolation structures 117, 119, 121, and 123) that are coupled to (e.g., directly contact) the deep trench isolation structure 107 and are disposed between adjacent photodiode regions 105 (e.g., first partial isolation structure 117 is disposed between first photodiode region 105-1 and photodiode region 105-2 along the z-axis of coordinate system 195). It is appreciated that the partial isolation structures 117, 119, 121, and 123 are part of a common interconnected structure (e.g., one or more of the partial isolation structures 117, 119, 121, and/or 121 extend from the deep trench isolation structure 115). In one embodiment, one or more of the partial isolation structures 117, 119, 121, and 123 extend laterally from the deep trench isolation structure 115 towards a center point or region of the multi-pixel detector (e.g., a region centrally located between the photodiode regions 105-1, 105-2, 105-3, and 105-4), but do not extend into the center point or region. In other words, the partial isolation structures 117, 119, 121, and 123 do not directly contact one another. In another embodiment the partial isolation structures 117, 119, 121, and 123 may not extend from the deep trench isolation structure 115 (e.g., a portion of the semiconductor substrate may be disposed between the partial isolation structure and the deep trench isolation structure).

In one embodiment, pairs of partial isolation structures may be parallel with one another and/or perpendicular to one another. For example, the partial isolation structures 117 and 121 are oriented along a first common direction (e.g., direction parallel to the x-axis) while the partial isolation structures 119 and 123 are oriented along a second common direction (e.g. direction parallel to the y-axis) that is perpendicular to the first common direction. In the illustrated embodiment, each of the partial isolation structures 117, 119, 121, and 123 have a common lateral length (e.g., distance traversed in the x-y plane). However, in other embodiments one or more of the partial isolation structures 117, 119, 121, and 123 may have different lateral lengths (e.g., partial isolation structure 117 may have a lateral length less than the lateral length of partial isolation structures 119, 121, and 123).

The other quadrants of repeat unit 103 (e.g., second quadrant 109, third quadrant 111, and fourth quadrant 113) each include a two-by-two array of image pixels (e.g., defined by the photodiode regions 105 within the respective quadrants). Each of the image pixels is optically coupled with an individual microlens and a color filter to generate an image of an external scene. For example, quadrants 109, 111, and 113 may each respectively have a red, green, and blue color filter that may provide color and intensity information of a portion of the external scene.

FIG. 1C illustrates a magnified top view of a partial isolation structure included in the multi-pixel detector of the first quadrant 107 shown in FIG. 1B, in accordance with the teachings of the present disclosure. More specifically, FIG. 1C is a view of the multi-pixel detector oriented with the x-y plane of coordinate system 195 and includes first photodiode region 105-1, second photodiode region 105-2, deep trench isolation structure 115, first partial isolation structure 117, second partial isolation structure 119, and third partial isolation structure 123 disposed within semiconductor substrate 101.

As illustrated, the first photodiode region 105-1 is disposed adjacent to the second photodiode region 105-2. The first partial isolation structure 117 is disposed between the first photodiode region 105-1 and the second photodiode region 105-2. A length 133 of a lateral portion of the first partial isolation structure 117 disposed between the first photodiode region 105-1 and second photodiode region 105-2 is less than a lateral length 131 of the first photodiode region 105-1. More specifically, the first photodiode region 105-1, the second photodiode region 105-2, and the first partial isolation structure 117 are positioned in the semiconductor substrate 101 such that a first cross-section of the multi-pixel detector taken along a first direction AA' extends through the first photodiode region 105-1, the second photodiode region 105-2, and the first partial isolation structure 117 while a second cross-section of the multi-pixel detector taken along a second direction BB' parallel to the first direction AA' extends through the first photodiode region 105-1 and the second photodiode region 105-2 but not the first partial isolation structure 117.

It is appreciated that the critical dimension of both the partial isolation structure 117 and the deep trench isolation structure 115 may be the same (e.g., 0.2 μm) or different. The critical dimension may be referred to as a width or thickness and may correspond to a distance traversed by an element perpendicular to a longitudinal direction of the element. For example, the critical dimension of the partial isolation structure 117 may correspond to the distance the partial isolation structure 117 traverses in the direction of the y-axis of the coordinate system 195, which is perpendicular to the longitudinal direction (i.e., direction of the x-axis of the coordinate system 195) of the partial isolation structure 117.

FIGS. 1D and 1E respectively illustrate partial cross sectional views 100-AA' along line A-A' and 100-BB' along line B-B' of image sensor 100 shown in FIG. 1B, in accordance with the teachings of the present disclosure. More specifically, representative cross sectional views of the first quadrant 107 and the second quadrant 109 of the repeat unit 103 along the y-z plane of the coordinate system 195 are illustrated. The first quadrant 107 includes a multi-pixel detector 151 capable of gathering phase information of an external scene (e.g., for phase detection autofocus) while the second quadrant 109 includes a group of adjacent image pixels, including image pixels 153-1 and 153-2, for imaging an external scene.

The multi-pixel detector 151 of the first quadrant 107 includes the photodiode regions 105, the deep trench isolation structure 115, the partial isolation structure 117, color filter 139, shared microlens 141, and metal grid 145. The partial isolation structure 117 extends from a first side 135 of the semiconductor substrate 101 towards a second side 137 of the semiconductor substrate (i.e., in a direction of the z-axis of the coordinate system 195) between the first photodiode region 105-1 and the second photodiode region 105-2. The deep trench isolation structure 115 (e.g., portions of the deep trench isolation structure 115-3 and/or 115-4) and the partial isolation structure 117 extend from the first side 135 (e.g., backside) of the semiconductor substrate 101 toward the second side 137 (e.g., frontside) of the semiconductor substrate 101 a first depth and a second depth, respectively. As illustrated, the first depth is substantially equal to the second depth as the deep trench isolation structure 115 and the partial isolation structure 117 extend an equal depth into the semiconductor substrate 101 in a direction along the z-axis.

The shared microlens 141 of the multi-pixel detector 151 is optically aligned with each of the photodiode regions 105 included in the first quadrant 107 (e.g., first photodiode region 105-1, 105-2, 105-3, and 105-4 of the first quadrant 107 in repeat unit 103 illustrated in FIG. 1B) and an individual color filter 139 (e.g., a green color filter). More specifically, the shared microlens 141 is shaped to direct incident light through the color filter 139 towards the photodiode regions 105 included in the first quadrant 107. The light incident upon the photodiode regions 105 of the multi-pixel detector 151 generates image charge that may be quantified in the form of a voltage or current measurement. The measurement obtained between adjacent pixels in the multi-pixel detector 151 may be compared to gather or otherwise determine phase information (e.g., for autofocus).

As illustrated, the partial isolation structure 117 extends laterally (e.g., direction parallel to x-axis of the coordinate system 195) between the first photodiode region 105-1 and the second photodiode region 105-2 in the multi-pixel detector 151. However, the partial isolation structure does not extend across an entire length of the first photodiode region 105-1 and the second photodiode region 105-2, as shown in the view 100-BB' of FIG. 1E. The length of the partial isolation structure (e.g., distance traversed in the direction of the x-axis for partial isolation structure 117) is tailored to provide balance between light sensitivity and selectivity. The partial isolation structures may mitigate or reduce electrical crosstalk (e.g., bloom) between adjacent photodiode regions (e.g., between photodiode region 105-1 and 105-2). In some embodiments, the partial isolation structure may also partially attenuate and/or reflect incident light.

The second quadrant 109 includes the image pixels 153-1 and 153-2, which may be substantially similar or identical to other image pixels included in the second quadrant (e.g., as illustrated in FIG. 1B, the second quadrant 109 includes a two-by-two array of image pixels). As illustrated, each image pixel 153 includes an individual microlens optically aligned with a photodiode region (e.g., microlens 143-1 is optically aligned with photodiode region 105-1 of the second quadrant 109). Each of the microlenses (e.g., shared microlenses 141 and/or individual microlenses 143) may be formed of a polymer (e.g., polymethylmethacrylate, polydimethylsiloxane, etc.) or other material and be shaped to have optical power for converging, diverging, or otherwise directing light incident upon the microlenses through a corresponding optically aligned one of the plurality color filters 139 to a respective one of the plurality of photodiode regions 105.

The color filters 139 have a respective spectral photoresponse, which describes the portion of the electromagnetic spectrum that the color filter transmits (e.g., color filter 139-R transmits "red" light while reflecting or attenuating portions of the electromagnetic spectrum outside of the "red" color). Disposed between the color filters 139 is a metal grid 145, which separates color filters with different spectral photoresponse and reflects light incident upon the metal grid 145 toward an adjacent photodiode region 105.

It is appreciated that when viewing FIG. 1D or 1E in relation to FIG. 1A-1C, that the multi-pixel detector 151 in a given repeat unit 103 is laterally surrounded by a plurality of image pixels 153 included in the given repeat unit 103 and adjacent repeat units. Thus, the shared microlens 151 of the given repeat unit is also laterally surrounded by individual microlenses 143 included in the given repeat unit and the adjacent repeat units.

Referring back to FIG. 1B, it is appreciated that each repeat unit 103 includes different color filters to generate a "full color" image of the external scene. For example, the color filter of the first quadrant 107, the second quadrant 109, the third quadrant 111, and the fourth quadrant 113 may respectively have a spectral photoresponse of green, red, green, and blue to generate "full color" information of a portion of the external scene. In some embodiments, only the quadrants of a given repeat unit with image pixels (i.e., not the multi-pixel detector) are utilized to generate image information. However, in other embodiments, all quadrants may be utilized for gathering image information (e.g., the multi-pixel detector may provide image information in addition to the provided phase information during different image acquisition steps). It is appreciated that different color filter patterns may be utilized other than the quad-Bayer (i.e., BGGR), in accordance with embodiments of the disclosure.

It is appreciated that image sensor 100 of FIGS. 1A-1E may be fabricated by semiconductor device processing and microfabrication techniques known by one of ordinary skill in the art. In one embodiment, fabrication of image sensor 100 may include providing a semiconductor substrate (e.g., a silicon wafer having a front side and a back side), forming a mask or template (e.g., out of cured photoresist) on the front side of the semiconductor material via photolithography to provide a plurality of exposed regions of the front side of semiconductor material, doping (e.g., via ion implantation, chemical vapor deposition, physical vapor deposition, and the like) the exposed portions of the semiconductor material to form the plurality of photodiode regions 105 that extend into the semiconductor substrate 101 from the front side 135 of semiconductor substrate 101, removing the mask or template (e.g., by dissolving the cured photoresist with a solvent), and planarizing (e.g., via chemical mechanical planarization or polishing) the front side of semiconductor substrate 101. In the same or another embodiment, photolithography may be similarly used to form the plurality of color filters 139 (e.g., via cured pigmented polymers having a desired spectral photoresponse), the plurality of shared microlenses 141, the plurality of individual microlenses 143 (e.g., polymer based microlenses having a target shape and size formed from a master mold or template), the metal grid 145, the deep trench isolation structure 115, and the partial isolation structures 117. It is noted that the deep trench isolation structure and the partial isolation structures may be formed by etching a trench into the semiconductor substrate 101 and then filling the trench with a target material that forms the corresponding structure (e.g., one or more dielectric materials such as silicon dioxide). In some embodiments, the trench formed for the deep trench isolation structure 115 and/or the partial isolation structures 117 may be lined with one or more dielectric materials (e.g., silicon dioxide) and then further filled with another material (e.g., undoped polycrystalline silicon). It is appreciated that the described techniques are merely demonstrative and not exhaustive and that other techniques may be utilized to fabricate one or more components of image sensor 100.

FIG. 2A illustrates a partial cross sectional view of an image sensor with a multi-pixel detector 251 without a partial isolation structure, in accordance with the teachings of the present disclosure. The multi-pixel detector includes a semiconductor substrate 201, a first photodiode region 205-1, a second photodiode region 205-2, a deep trench isolation structure 215, a color filter 239, a shared microlens 241, and a metal grid 245. Notably, the multi-pixel detector 251 is comparable to the multi-pixel detector 151 illustrated in FIGS. 1D and 1E with the exception that the multi-pixel detector 251 does not include a partial isolation structure (e.g., partial isolation structure 117 of FIG. 1D). By omitting the partial isolation structure, the multi-pixel structure 251 increases light sensitivity of the photodiode regions at the cost of angular selectivity with respect to exposure time.

FIG. 2B illustrates angular selectivity with respect to exposure time of the multi-pixel detector 251 without a partial isolation structure shown in FIG. 2A, in accordance with the teachings of the present disclosure. More specifically, FIG. 2B shows pixel response time in arbitrary units with respect to angle of incident light (i.e., θ illustrated in FIG. 2A) for a first exposure time (e.g., graph 270) and a second exposure time (e.g., graph 280). The y-axis of the graphs 270 and 280 is the pixel response, which corresponds to the measured signal (e.g., voltage or current measurement) associated with adjacent photodiode regions (e.g., photodiode regions 205-1 and 205-2). The x-axis of the graphs 270 and 280 corresponds to the angle of incident light as shown in FIG. 2A, in which theta (θ) is the angle of the incident light measured from the normal of the multi-pixel detector. The solid and dashed lines of the graphs 270 and 290 respectively correspond to a right photodiode region (e.g., photodiode region 205-2 of FIG. 2A) and a left photodiode region (e.g., photodiode region 205-1 of FIG. 2A).

Referring back to FIG. 2B, the first exposure time of graph 270 is greater than the second exposure time of graph 280. In the illustrated embodiment, the first and second exposure times correspond, respectively, to approximately 0.5 second and 0.07 second durations. However, it is appreciated that other exposure durations for autofocus or gathering phase information may be utilized. As shown by comparing graphs 270 and 280, the longer exposure time results in less well defined pixel response peaks indicating a reduced angular selectivity relative to the shorter exposure time. It is further appreciated that variance in angular selectivity with respect to exposure time for adjacent photodiode regions included in a multi-pixel detector may further be influenced based on the position of the multi-pixel detector within the image sensor. For example, a multi-pixel detector centrally located on an image sensor may have a different degree of angular selectivity relative to a multi-pixel detector located proximate to an outer edge of the image sensor.

However, it may be desirable to utilize different exposure times for autofocus dependent upon lighting conditions. For example, in low light conditions, it may be desirable to use longer exposure times relative to normal lighting conditions for gathering phase information. Thus, in some embodiments, it may be desirable to mitigate variance in angular selectivity of the multi-pixel detectors of an image sensor with respect to exposure time and/or position of the multi-pixel detectors within the image sensor. As shown in embodiments of the present disclosure (see, e.g., FIGS. 3A and 3B), variance in angular selectivity may be normalized across an image sensor by adjusting a length of one or more partial isolation structures in the multi-finger isolation structure of the multi-pixel detector, offsetting the shared microlens, or a combination thereof.

Figure 3A:
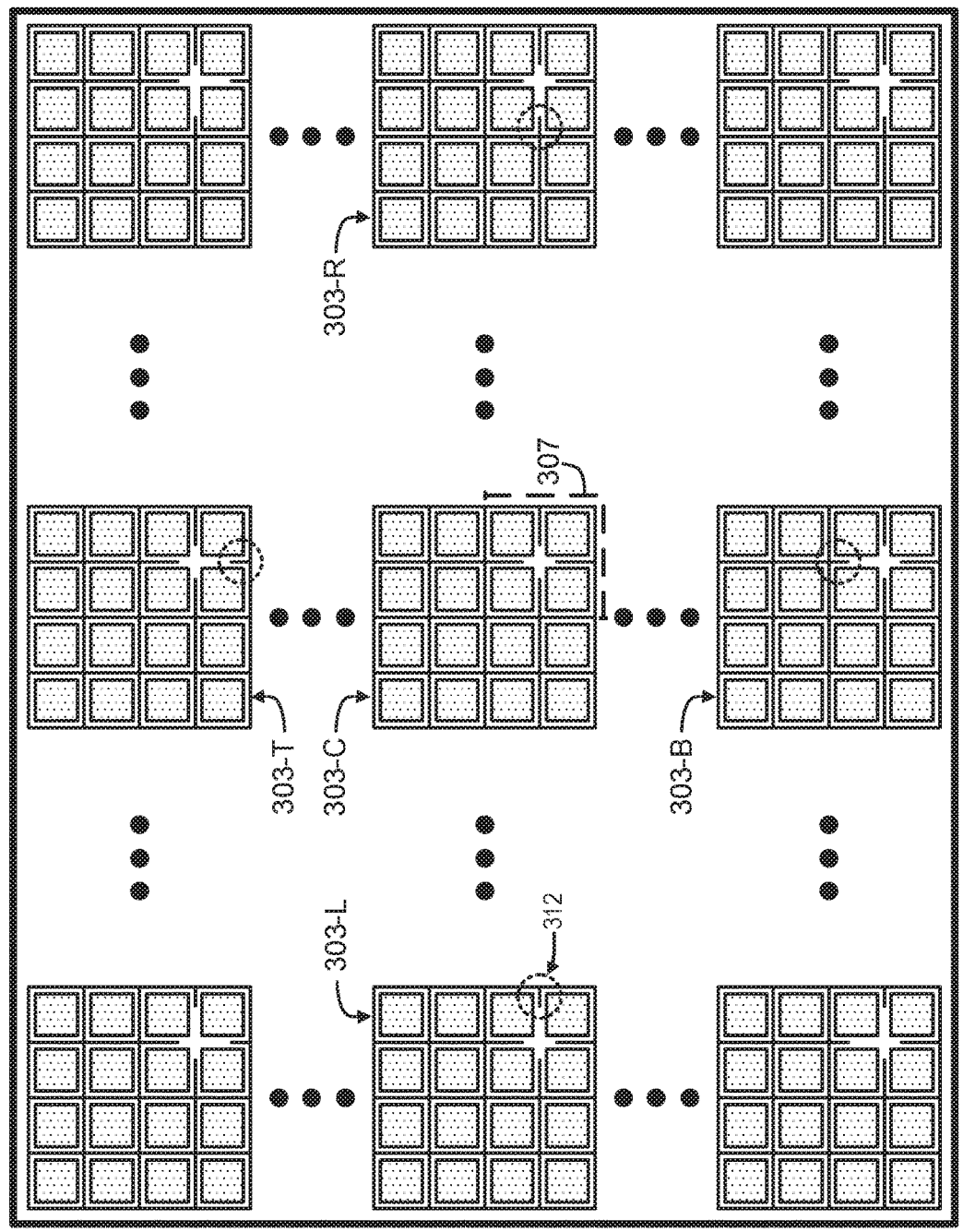
FIG. 3A illustrates a top view of an image sensor with multi-pixel detectors and partial isolation structures having varying lateral lengths based on relative position within the image sensor, in accordance with the teachings of the present disclosure.

FIG. 3A illustrates a top view of an image sensor 300 with multi-pixel detectors and partial isolation structures of varying lateral lengths based on relative position within the image sensor 300, in accordance with the teachings of the present disclosure. Image sensor 300 is a variant of image sensor 100 illustrated in FIGS. 1A-1E modified to have substantially uniform angular selectivity to incident light with respect to exposure time throughout the image sensor 300 (e.g., angular selectivity for each repeat unit 303 is substantially similar for a first exposure time and a second exposure time).

Image sensor 300 of FIG. 3A includes a plurality of repeat units 303, each including a first quadrant 307 that includes a multi-pixel detector capable of gathering phase information, which is similar to the first quadrant 107 described in FIGS. 1B-1E. One difference is the lateral lengths of one or more partial isolation structures 312 (i.e., the partial isolation structures annotated by the dashed circle in FIG. 3A) included in each of the plurality of repeat units 303 are adjusted based on position within the image sensor 300 such that the multi-pixel detector of each of the plurality of repeat units 303 have a substantially equal angular selectivity to incident light with respect to light exposure time throughout the image sensor 300. For example, the partial isolation structures 312 annotated by the dashed circle have lateral lengths that are less than the lateral lengths of other partial isolation structures included in a corresponding repeat unit 303. Referring to the first quadrant 307 (i.e., the multi-pixel detector) of repeat unit 303-L, the lateral length of partial isolation structure 312 is less than a corresponding lateral length of at least one of the other partial isolation structures (e.g., the unannotated second, third, and fourth partial isolation structures included in the multi-pixel detector of repeat unit 303-L).

Additionally, it is noted that lateral length of partial isolation structures may vary iteratively row-wise and column-wise across the entire image sensor 300. In other words, the adjusted partial isolation structures 312 of repeat units may increase in lateral length as the position of a given repeat unit moves from an outermost position to a centermost position within the image sensor 300. For example, repeat unit 303-C is positioned centrally within the plurality of repeat units 303. Each of the four partial isolation structures of repeat unit 303-C have a common lateral length that is greater than the lateral length of one or more partial isolation structures 312 of other repeat units (e.g., repeat units 303-L, 303-R, 303-T, and 303-B).

Figure 3B:
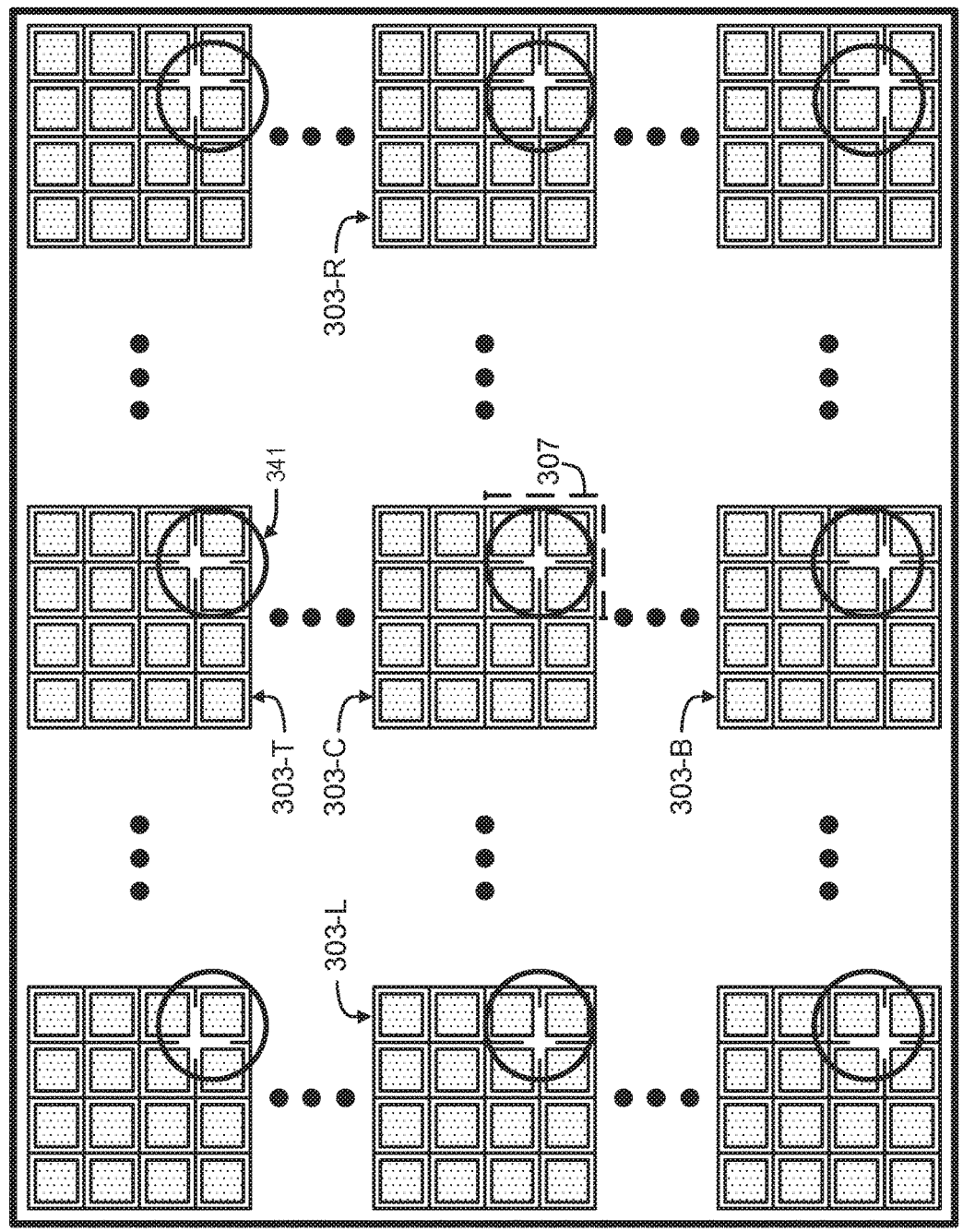
FIG. 3B illustrates a top view of an image sensor with multi-pixel detectors, partial isolation structures, and offset shared microlenses, in accordance with the teachings of the present disclosure.

FIG. 3B illustrates a top view of an image sensor 350 with multi-pixel detectors, partial isolation structures, and offset shared microlenses 341, in accordance with the teachings of the present disclosure. Image sensor 300 is similar to image sensor 350, but further includes shared microlenses 341 that are offset (i.e., the focal point of the microlens is not positioned at a midpoint of the multi-pixel detector) based on a position of a given repeat unit 303 within the image sensor 350. Advantageously, by offsetting the shared microlens 341, the angular selectivity of the multi-pixel detector included in each of the repeat units 303 may be further tuned to be normalized across the image sensor 350 with respect to exposure time. For example, similar to how the lateral length of different partial isolation structures may be adjusted based on position, a degree of offset for each of the shared microlens 341 may be adjusted such that the multi-pixel detector included in each of the plurality of repeat units 303 have a substantially equal angular selectivity to incident light with respect to light exposure time throughout the image sensor 350. As illustrated in FIG. 3B, the degree of offset increases from a midpoint (e.g., repeat unit 303-C with no offset) of the image sensor towards a perimeter of the image sensor (e.g., outermost repeat units such as 303-T, 303-B, 303-R, and 303-L have a greater degree of offset than repeat units located closer to the center repeat unit 303-C).

Figure 4:
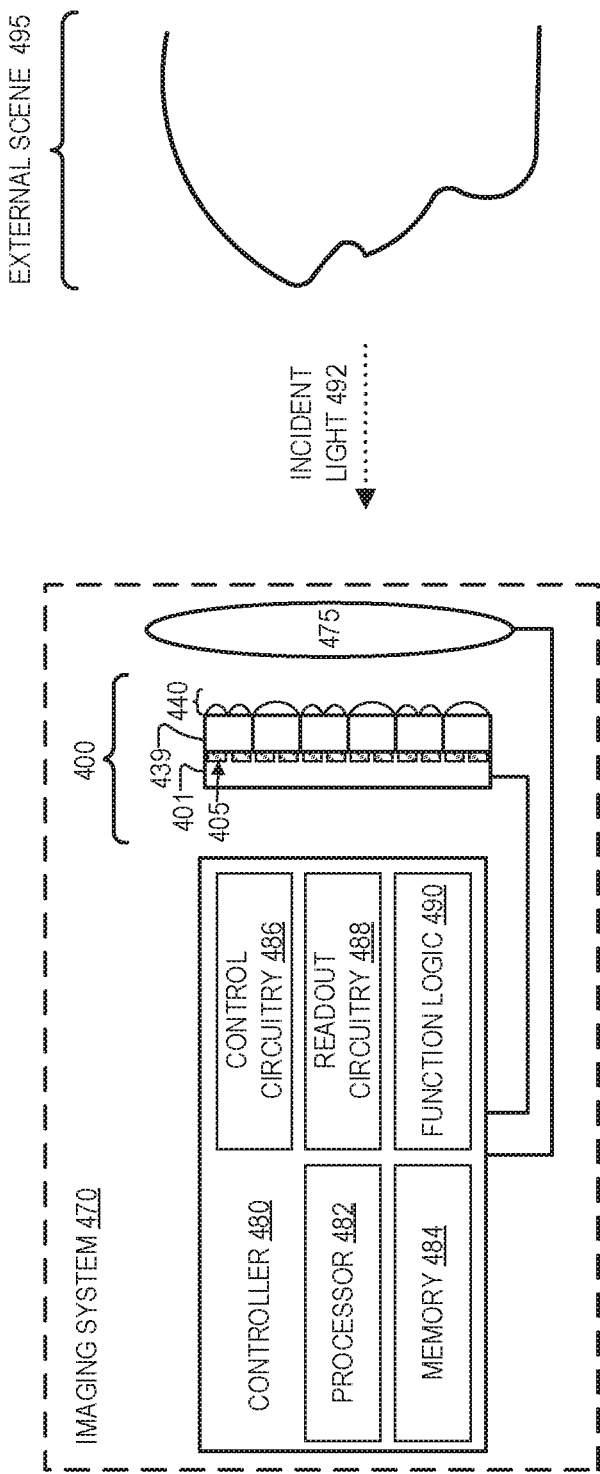
FIG. 4 is a functional block diagram of an imaging system including an image sensor with a multi-pixel detector and a partial isolation structure, in accordance with the teachings of the present disclosure.

FIG. 4 is a functional block diagram of an imaging system 470 including an image sensor 400 with a multi-pixel detector and a partial isolation structure, in accordance with the teachings of the present disclosure. Image sensor 400 of imaging system 470 may be implemented by any one of the embodiments described in the present disclosure (e.g., image sensor 100 of FIG. 1A-1E, image sensor 300 of FIG. 3A, and/or image sensor 35 of FIG. 3B).

Imaging system 470 is capable of focusing on a point of interest (POI) within an external scene 495 in response to incident light 492. Imaging system 470 includes image sensor 400 to generate signals (e.g. phase information obtained via one or more multi-pixel detectors) in response to incident light 492, objective lens(es) 475 with adjustable optical power to focus on one or more points of interest within the external scene 492, and controller 480 to control, inter alia, operation of image sensor 400 and objective lens(es) 475. Image sensor 400 is one possible implementation of image sensor 100 illustrated in FIGS. 1A-1E and includes semiconductor material 401 with a plurality of photodiode regions 305 to form image pixels and/or multi-pixel detector with partial isolation structures, a plurality of color filters 439, and a plurality of microlenses 440 (e.g., shared microlenses and/or individual microlenses arranged in a manner similar to any one of the embodiments described in FIGS. 1A-3B). The controller 480 illustrated in FIG. 4 includes one or more processors 482, memory 484, control circuitry 486, readout circuitry 488, and function logic 490.

The controller 480 includes logic and/or circuitry to control the operation (e.g., during pre-, post-, and in situ phases of image and/or video acquisition) of the various components of imaging system 470. The controller 480 may be implemented as hardware logic (e.g., application specific integrated circuits, field programmable gate arrays, system-on-chip, etc.), software/firmware logic executed on a general purpose microcontroller or microprocessor, or a combination of both hardware and software/firmware logic. In one embodiment, the controller 480 includes the processor 482 coupled to memory 484 that store instructions for execution by the controller 480 or otherwise by one or more components of the imaging system 470. The instructions, when executed by the controller 480, may cause the imaging system 470 to perform operations that may associated with the various functional modules, logic blocks, or circuitry of the imaging system 470 including any one of, or a combination of, the control circuitry 486, the readout circuitry 488, the function logic 490, image sensor 400, objective lens 475, and any other element of imaging system 470 (illustrated or otherwise). The memory is a non-transitory computer-readable medium that may include, without limitation, a volatile (e.g., RAM) or non-volatile (e.g., ROM) storage system readable by controller 480. It is further appreciated that the controller 480 may be a monolithic integrated circuit, one or more discrete interconnected electrical components, or a combination thereof. Additionally, in some embodiments the one or more electrical components may be coupled to one another to collectively function as the controller 480 for orchestrating or otherwise controlling operation of the imaging system 470.

Control circuitry 486 may control operational characteristics of the imaging system 470 (e.g., exposure duration, when to capture digital images or videos, and the like). Readout circuitry 488 reads or otherwise samples the analog signal from the individual photodiode regions (e.g., read out electrical signals generated by each of the plurality of photodiode regions 405 that are representative of image charge generated in response to incident light to generate a phase detection autofocus signal, read out image signals to capture an image frame or video, and the like) and may include amplification circuitry, analog-to-digital (ADC) circuitry, image buffers, or otherwise. In the illustrated embodiment, readout circuitry 488 is included in controller 480, but in other embodiments readout circuitry 488 may be separate from the controller 480. Function logic 490 is coupled to the readout circuitry 488 to receive the signals to generate a phase-detection autofocus (PDAF) signal in response, generate an image in response to receiving image signals or data, and the like. In some embodiments, the signals may be respectively stored as a PDAF signal or image data and may be manipulated by the function logic 490 (e.g., calculate an expected image signal, bin image signals, demosaic the image data, apply post image effects such as crop, rotate, remove red eye, adjust brightness, adjust contrast, or otherwise).

The processes explained above may be implemented using software and/or hardware. The techniques described may constitute machine-executable instructions embodied within a tangible or non-transitory machine (e.g., computer) readable storage medium, that when executed by a machine (e.g., controller 120 of FIG. 1A) will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A multi-pixel detector of an image sensor, the multi-pixel detector comprising:
   a first photodiode region disposed within a semiconductor substrate to form a first pixel;
   a second photodiode region disposed within the semiconductor substrate to form a second pixel adjacent to the first pixel;
   a deep trench isolation structure laterally surrounding, collectively, the first photodiode region and the second photodiode region;
   a partial isolation structure extending from the deep trench isolation structure, the partial isolation structure including a lateral portion defined by a length and a width disposed between the first photodiode region and the second photodiode region, wherein the length of the lateral portion of the partial isolation structure disposed between the first photodiode region and the second photodiode region is less than a lateral length of the first photodiode region when viewed from a top-view, wherein the length of the lateral portion of the partial isolation structure extends along a longitudinal direction that is perpendicular to the width of the lateral portion of the partial isolation structure when viewed from the top-view, and wherein the length of the lateral portion is greater than the width.

2. The multi-pixel detector of claim 1, wherein the first photodiode region, the second photodiode region, and the partial isolation structure are positioned in the semiconductor substrate such that a first cross-section of the multi-pixel detector taken along a first direction extends through the first photodiode region, the second photodiode region, and the partial isolation structure while a second cross-section of the multi-pixel detector taken along a second direction parallel to the first direction extends through the first photodiode region and the second photodiode region but not the partial isolation structure.

3. The multi-pixel detector of claim 1, wherein the deep trench isolation structure and the partial isolation structure extend from a first side of the semiconductor substrate toward a second side of the semiconductor substrate a first depth and a second depth, respectively, and wherein the first depth is substantially equal to the second depth.

4. The multi-pixel detector of claim 1, further comprising:
   a third photodiode region disposed within the semiconductor substrate to form a third pixel; and
   a fourth photodiode region disposed within the semiconductor substrate to form a fourth pixel adjacent to the third pixel, and wherein the first pixel, the second pixel, the third pixel, and the fourth pixel are arranged in a two-by-two array of pixels to form a phase-detection autofocus sensor included in the image sensor.

5. The multi-pixel detector of claim 4, wherein the deep trench isolation structure laterally surrounds the first photodiode region, the second photodiode region, the third photodiode region, and the fourth photodiode region.

6. The multi-pixel detector of claim 5, further comprising: a multi-finger isolation structure extending from a first side of the semiconductor substrate towards a second side of the semiconductor substrate, the multi-finger isolation structure including:
a first partial isolation structure disposed between the first photodiode region and the second photodiode region, wherein the first partial isolation structure corresponds to the partial isolation structure;
a second partial isolation structure disposed between the second photodiode region and the third photodiode region;
a third partial isolation structure disposed between the third photodiode region and the fourth photodiode region; and
a fourth partial isolation structure disposed between the fourth photodiode region and the first photodiode region.

7. The multi-pixel detector of claim 6, wherein the first partial isolation structure, the second partial isolation structure, the third partial isolation structure, and the fourth partial isolation structure each extend laterally from the deep trench isolation structure towards a central region of the multi-pixel detector located between the first photodiode region, the second photodiode region, the third photodiode region, and the fourth photodiode region, and wherein each of the first partial isolation structure, the second partial isolation structure, the third partial isolation structure, and the fourth partial isolation structure do not extend into the central region.

8. The multi-pixel detector of claim 6, wherein the first partial isolation structure and the third partial isolation structure are aligned along a first common direction, wherein the second partial isolation structure and the fourth partial isolation structure are aligned along a second common direction, and wherein the first common direction is perpendicular to the second common direction.

9. The multi-pixel detector of claim 6, wherein a first lateral length of the first partial isolation structure is less than a corresponding lateral length of at least one of the second partial isolation structure, the third partial isolation structure, or the fourth partial isolation structure.

10. The multi-pixel detector of claim 4, further comprising:
a shared microlens optically aligned with the first photodiode region, the second photodiode region, the third photodiode region, and the fourth photodiode region.

11. The multi-pixel detector of claim 1, wherein the length of the lateral portion of the partial isolation structure extends parallel to the lateral length of the first photodiode region when viewed from the top view.

12. An image sensor including a plurality of repeat units, each repeat unit included in the plurality of repeat units comprising:
a first quadrant including to a multi-pixel detector to gather phase information for phase detection autofocus, wherein the multi-pixel detector includes:
a deep trench isolation structure forming a perimeter boundary of the first quadrant;
a first photodiode region, a second photodiode region, a third photodiode region, and a fourth photodiode region collectively arranged in two rows and two columns to form a two-by-two array of pixels laterally surrounded by the deep trench isolation structure; and
a multi-finger isolation structure including four partial isolation structures, each disposed between respective pairs of adjacent photodiode regions included in the two-by-two array of pixels, and wherein each of the four partial isolation structures extend laterally from the deep trench isolation structure, defining the perimeter boundary, towards a center of the two-by-two array of pixels without directly contacting one another.

13. The image sensor of claim 12, wherein the plurality of repeat units includes a first repeat unit, wherein the four partial isolation structures of the first repeat unit includes a first partial isolation structure, a second partial isolation structure, a third partial isolation structure, and a fourth partial isolation structure, and wherein a lateral length of the first partial isolation structure is less than a corresponding lateral length of at least one of the second partial isolation structure, the third partial isolation structure, or the fourth partial isolation structure.

14. The image sensor of claim 13, wherein the plurality of repeat units includes a second repeat unit positioned centrally within the plurality of repeat units, and wherein each of the four partial isolation structures of the second repeat unit have a common lateral length that is greater than the lateral length of the first partial isolation structure included in the first repeat unit.

15. The image sensor of claim 12, wherein lateral lengths of the four partial isolation structures included in each of the plurality of repeat units are adjusted such that the multi-pixel detector of each of the plurality of repeat units have a substantially equal angular selectivity to incident light with respect to light exposure time throughout the image sensor.

16. The image sensor of claim 12, wherein the first quadrant of each of the plurality repeat units further includes:
a shared microlens optically aligned with the first photodiode region, the second photodiode region, the third photodiode region, and the fourth photodiode region.

17. The image sensor of claim 16, wherein each of the plurality of repeat units further includes other quadrants, wherein each of the other quadrants include a two-by-two array of image pixels, and wherein each of the image pixels is optically coupled with an individual microlens.

18. The image sensor of claim 17, wherein the multi-pixel detector of a first repeat unit included in the plurality of repeat units is laterally surrounded by the image pixels of the first repeat unit and adjacent repeat units included in the plurality of repeat units, and wherein the shared microlens of the first repeat unit is laterally surrounded by the individual microlens included in the first repeat unit and the adjacent repeat units.

19. The image sensor of claim 16, wherein the shared microlens of a given repeat unit included in the plurality of repeat units is optically offset based on a position of the given repeat unit within the image sensor, and wherein a degree of the offset is adjusted such that the multi-pixel detector included in each of the plurality of repeat units have a substantially equal angular selectivity to incident light with respect to light exposure time throughout the image sensor.

20. The image sensor of claim 19, wherein the degree of offset increases from a midpoint of the image sensor towards a perimeter of the image sensor.

* * * * *